United States Patent
Yi et al.

(10) Patent No.: US 11,196,433 B2
(45) Date of Patent: Dec. 7, 2021

(54) DIGITAL-TO-ANALOG CONVERSION CIRCUIT

(71) Applicant: SMARTER MICROELECTRONICS (GUANG ZHOU) CO., LTD., Guangzhou (CN)

(72) Inventors: Jiangtao Yi, Guangzhou (CN); Xin Zhang, Guangzhou (CN); Qiang Su, Guangzhou (CN); Chifeng Liu, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 0 days.

(21) Appl. No.: 17/134,258

(22) Filed: Dec. 25, 2020

(65) Prior Publication Data

US 2021/0250034 A1    Aug. 12, 2021

Related U.S. Application Data

(63) Continuation of application No. PCT/CN2020/113678, filed on Sep. 7, 2020.

(30) Foreign Application Priority Data

Feb. 12, 2020 (CN) .......................... 202010089316.8

(51) Int. Cl.
*H03M 1/66* (2006.01)
*H03M 1/06* (2006.01)

(52) U.S. Cl.
CPC .................... *H03M 1/0617* (2013.01)

(58) Field of Classification Search
CPC ......... H03M 1/0617; H03M 1/10; H03M 1/66
USPC .................. 341/144, 139, 136, 133
See application file for complete search history.

(56) References Cited

U.S. PATENT DOCUMENTS

| 2008/0238327 | A1* | 10/2008 | Cho ...................... G09G 3/3241 |
| | | | 315/169.3 |
| 2015/0339834 | A1* | 11/2015 | Tseng .................... G06T 11/001 |
| | | | 345/589 |

\* cited by examiner

*Primary Examiner* — Peguy Jean Pierre
(74) *Attorney, Agent, or Firm* — Syncoda LLC; Feng Ma

(57) ABSTRACT

A digital-to-analog conversion circuit includes an operational amplification module having an operational amplifier connected to an output transistor to form a negative feedback circuit to obtain equal voltages at positive and negative ends. A negative end current flowing into the negative end is proportional to a positive end current flowing into the positive end. An input end of a conversion module is connected in parallel with a first resistor of the operational amplification module to obtain the same voltage as the first resistor, and an analog current proportional to the negative end current and positive end current. An output end of the conversion module is connected with the source of the output transistor and configured to receive the analog current and to make the analog current flow to an output resistor via the drain of the output transistor, to obtain an output current proportional to the positive end current.

20 Claims, 3 Drawing Sheets

DIGITAL-TO-ANALOG CONVERSION CIRCUIT

CROSS-REFERENCE TO RELATED APPLICATIONS

This application is a continuation of International Application No. PCT/CN2020/113678 filed on Sep. 7, 2020, which claims priority to Chinese Patent Application No. 202010089316.8 filed on Feb. 12, 2020. The disclosures of these applications are hereby incorporated by reference in their entirety.

BACKGROUND

With the development of semiconductor technology, digital-to-analog conversion circuits (DACs) are widely used in consumer electronic products, and among them, digital-to-analog conversion circuits with current mirror structure are widely used due to their characteristics such as fast conversion speed and high matching accuracy etc.

SUMMARY

The present disclosure relates generally to the field of semiconductor technologies, and more specifically to a digital-to-analog conversion circuit.

The embodiments of the disclosure provide a digital-to-analog conversion circuit, and the circuit includes an operational amplification module and a conversion module;

the operational amplification module includes an operational amplifier, an output transistor and a first resistor;

an output end of the operational amplifier is connected with the gate of the output transistor, a negative end of the operational amplifier is connected with the source of the output transistor, and voltage at the negative end is supplemented based on the voltage supplied by the source of the output transistor, so that voltages at positive and negative ends are equal, as well as a negative end current flowing into the negative end is proportional to a positive end current flowing into the positive end; and the conversion module is configured to convert digitals to an analog current; and an input end of the conversion module is connected with a first end of the first resistor of the operational amplification module, and an output end of the conversion module is connected with a second end of the first resistor of the operational amplification module and the negative end of the operational amplifier, so that the same voltage as the first resistor of the operational amplification module is obtained, as well as the analog current proportional to the negative end current and positive end current is obtained; and the output end of the conversion module is also connected with the source of the output transistor, and is configured to receive the analog current and to make the analog current flow to an output resistor via the drain of the output transistor, to obtain an output current proportional to the positive end current.

In the above solution, the operational amplification module further includes a second resistor; and a first end of the second resistor is connected with the first end of the first resistor of the operational amplification module, and a second end of the second resistor is connected with the positive end of the operational amplifier.

In the above solution, the circuit further includes a reference current module; and the reference current module includes a reference resistor, a reference transistor and a reference current source; and the reference current module is configured to provide the positive end current for the second resistor of the operational amplification module.

In the above solution, a first end of the reference resistor of the reference current module is connected with the first end of the second resistor of the operational amplification module, and a second end of the reference resistor of the reference current module is connected with the source of the reference transistor.

In the above solution, the drain of the reference transistor of the reference current module is connected with the reference current source.

In the above solution, the operational amplifier includes transistors; and the transistors corresponding to the positive and negative ends form a current mirror with the reference transistors of the reference current module.

In the above solution, the reference current module is configured to provide a bias voltage for the transistors in the operational amplifier.

In the above solution, the conversion module includes multiple branches; each of the branches includes a resistor and a switch; and a first end of the resistor of each of the branches is connected with the input end, a second end of the resistor is connected with a first end of the switch, and a second end of the switch is connected with the output end.

In the above solution, the input end of the conversion module, the first end of the first resistor and the first end of the second resistor are all connected with a power supply.

In the above solution, the first end of the reference resistor of the reference current module is also connected with the power supply.

In the digital-to-analog conversion circuit provided by the embodiments of the disclosure, a negative feedback circuit is formed by connecting the output end of the operational amplifier with the gate of the output transistor and by connecting the negative end of the operational amplifier with the source of the output transistor, making the voltages at the positive and negative ends of the operational amplifier be equal and further ensuring that the currents at the positive and negative ends are proportional, while the output end of the conversion module is connected in parallel with the first resistor, making the current on the conversion module be proportional; and furthermore, the accuracy of the output current of the digital-to-analog conversion circuit is ensured.

DETAILED DESCRIPTION

Due to the progress of the process, the power supply voltage of the chip becomes lower and lower, a lower and lower voltage can be consumed on the current mirror, which will inevitably affect the accuracy of the output current of the digital-to-analog conversion circuit.

Figure 1:
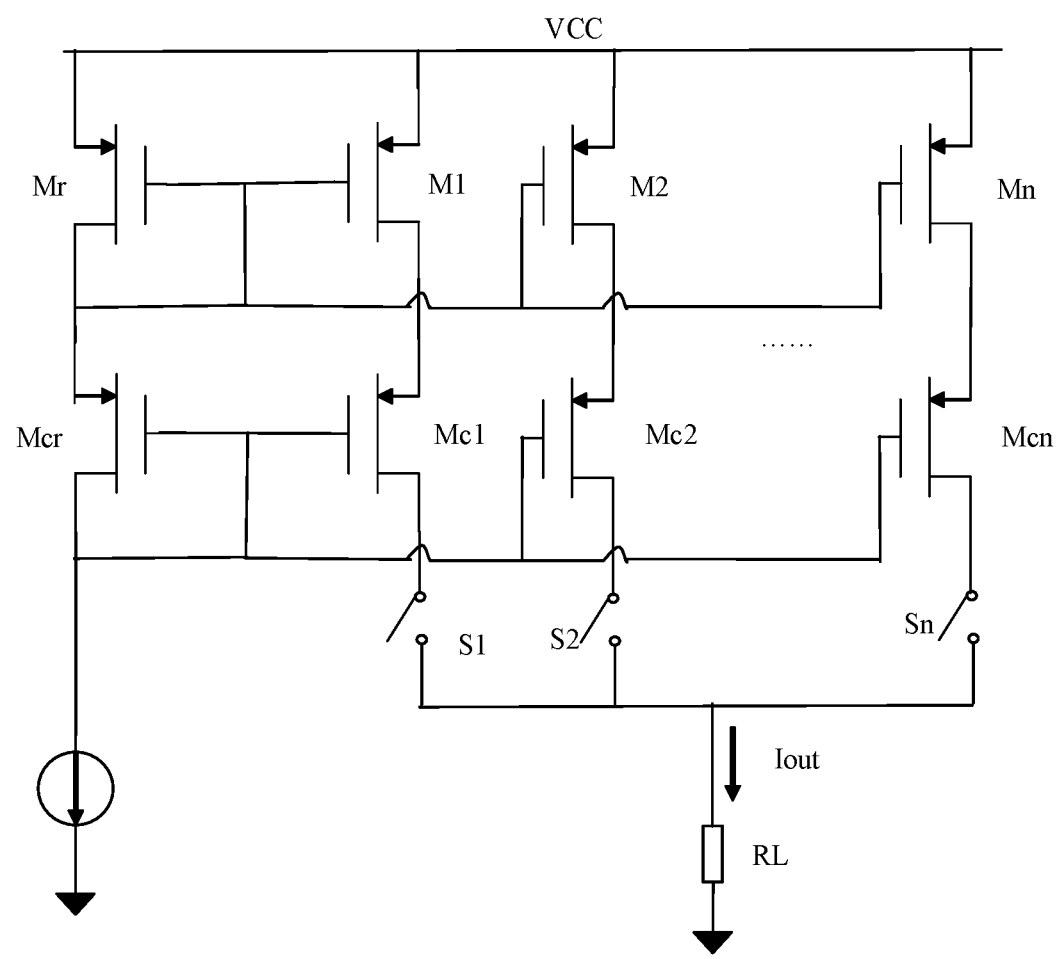
FIG. 1 is a schematic diagram of the structure of a digital-to-analog conversion circuit with a current mirror structure according to some embodiments.

A digital-to-analog conversion circuit with a current mirror structure is illustrated in FIG. 1, and all the transistors in FIG. 1 are PMOS transistors. Here, the branch including M1, Mc1 and S1 is regarded as the first branch, and the branch including M2, Mc2 and S2 is regarded as the second branch, . . . , and the branch including Mn, Mcn and Sn is regarded as the nth branch, and these branches together constitute part of the digital-to-analog conversion circuit. The left side reference current source Iref is the reference current branch, and Mr is the current mirror reference transistor, and M1, M2, . . . , Mn are the mirror transistors; and Mcr, Mc1, Mc2, . . . , Mcn are cascade transistors, and the function of cascade transistors is to ensure the same Vds for the mirror transistor and reference transistor, and to increase the matching accuracy of mirror transistor and current mirror reference transistor.

However, with the progress of the process, the power supply voltage on the chip becomes lower and lower, but the voltage consumed by each transistor during normal operation is fixed, and as illustrated in FIG. 1, the voltage headroom consumed by the output transistor of the current mirror on one branch is 2*Vdsat+Vth. When the threshold voltage of PMOS transistor is 0.7 v, and the turn-on voltage of the $V_{GS}$ of the PMOS transistor is 0.2 v, then the headroom of the digital-to-analog conversion circuit with this structure of current mirror is 1.1 v, and by further considering the process corner and change of temperature, when the power supply voltage provided on the chip is 2.5 v, then the voltage distributed to the output resistor $R_L$ is 1.4 v, which cannot ensure the accuracy of the output current of the output resistor $R_L$.

Figure 2:
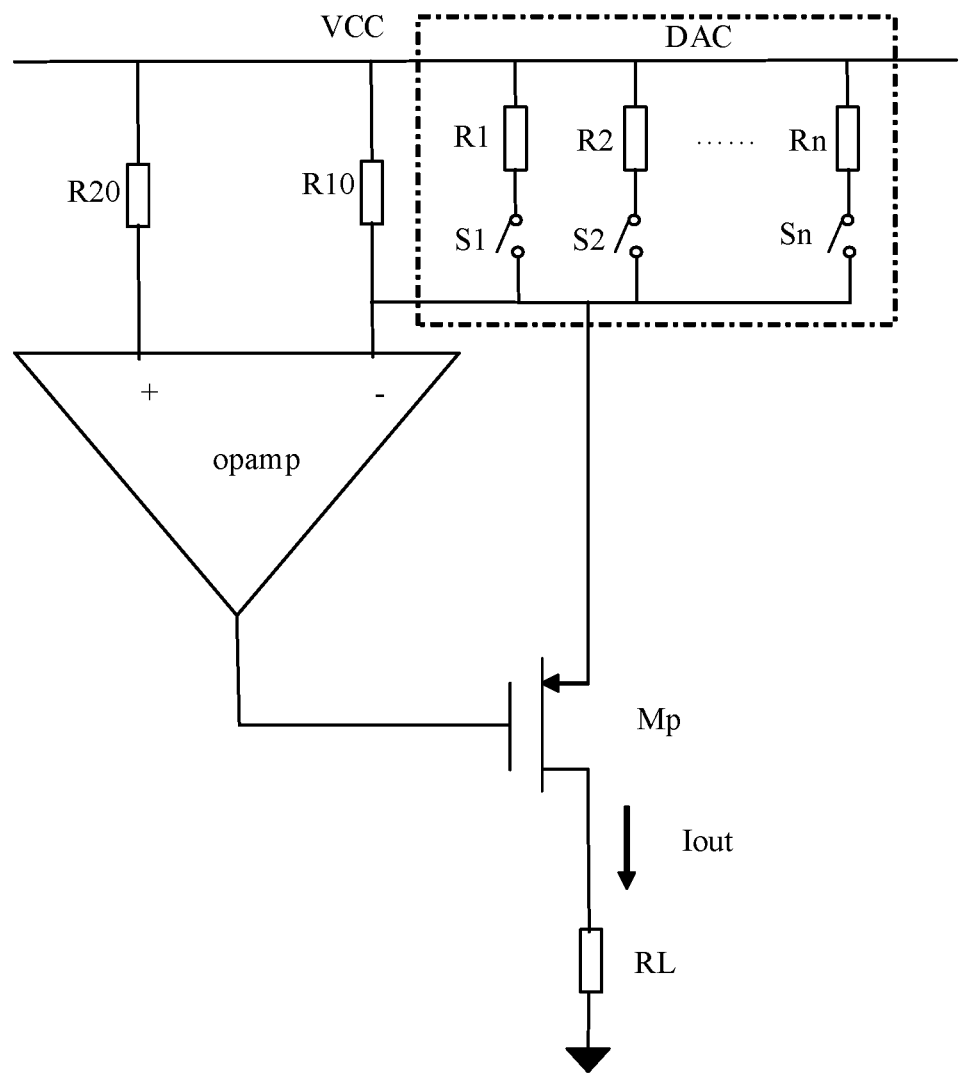
FIG. 2 is a schematic diagram of the structure of a digital-to-analog conversion circuit provided by an embodiment of the disclosure.

In view of the above problem, the embodiments of the disclosure provide a digital-to-analog conversion circuit as illustrated in FIG. 2, which includes an operational amplification module OP and a conversion module DAC; and the operational amplification module OP includes an operational amplifier opamp, an output transistor Mp, and a first resistor R10.

Figure 3:
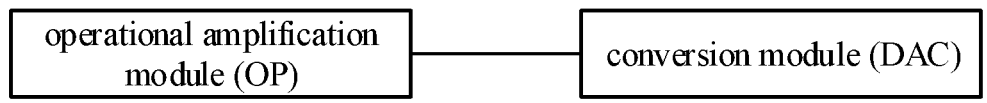
FIG. 3 is a block diagram of the structure of a digital-to-analog conversion circuit provided by an embodiment of the disclosure.

As illustrated in FIG. 3, it is a block diagram of the structure of a digital-to-analog conversion circuit provided by an embodiment of the disclosure, and the digital-to-analog conversion circuit includes an operational amplification module OP and a conversion module DAC.

The output end of the operational amplifier opamp is connected with the gate of the output transistor Mp, the negative end of the operational amplifier opamp is connected with the source of the output transistor Mp, and voltage at the negative end is supplemented based on the voltage supplied by the source of the output transistor Mp, so that voltages at positive and negative ends are equal, as well as the negative end current flowing into the negative end is proportional to the positive end current flowing into the positive end.

The conversion module DAC is configured to convert digitals to an analog current; and the input end of the conversion module DAC is connected with the first end of the first resistor R10 of the operational amplification module OP, and the output end of the conversion module DAC is connected with the second end of the first resistor R10 of the operational amplification module OP and the negative end of the operational amplifier opamp, so that the same voltage as the first resistor R10 of the operational amplification module OP is obtained, as well as the analog current proportional to the negative end current and positive end current is obtained; and the output end of the conversion module DAC is also connected with the source of the output transistor Mp, and is configured to receive the analog current and to make the analog current flow to the output resistor $R_L$ via the drain of the output transistor Mp, to obtain an output current Iout proportional to the positive end current.

In FIG. 2, the circuit includes a conversion module DAC and an operational amplification module, here, the operational amplification module OP includes an operational amplifier opamp, an output transistor Mp and a first resistor R10. The output transistor Mp of the embodiments of the disclosure is a PMOS transistor. The first end of the first resistor R10 is connected with the input end of the conversion module DAC, and the second end of the first resistor R10 is connected with the negative end of the operational amplifier opamp and also connected with the output end of the conversion module DAC; and the output end of the operational amplifier opamp is connected with the gate of the output transistor Mp, and the source of the output transistor Mp is connected with the negative end of the operational amplifier opamp to form a negative feedback circuit, and the voltage supplied by the source of the output transistor Mp is supplemented to the negative end of the operational amplifier opamp, so that the values of voltages at the positive end and negative end of the operational amplifier opamp are equal, and at this time, it ensures that the negative end current flowing into the negative end of the operational amplifier opamp is proportional to the positive end current flowing into the positive end of the operational amplifier opamp.

The operational amplification module OP further includes a second resistor R20; and the first end of the second resistor R20 is connected with the first end of the first resistor R10 of the operational amplification module OP, and the second end of the second resistor R20 is connected with the positive end of the operational amplifier opamp.

In FIG. 2, according to the above connection mode, the first resistor R10 and the second resistor R20 of the operational amplification module OP are connected in parallel, so that the values of voltages on the first resistor R10 and the second resistor R20 are equal, which further ensures that the current on the first resistor R10 is proportional to the current on the second resistor R20. Since the current on the first resistor R10 flows into the negative end of the operational amplifier opamp and the current on the second resistor R20 flows into the positive end of the operational amplifier opamp, it further ensures that the negative end current flowing into the negative end of the operational amplifier opamp is proportional to the positive end current flowing into the positive end of the operational amplifier opamp.

In an embodiment, the conversion module DAC in FIG. 2 is configured to convert digitals into analog currents; and the input end of the conversion module DAC is connected with the first end of the first resistor R10, and the output end of the conversion module DAC is connected with the second end of the first resistor R10 and the negative end of the operational amplifier opamp, that is, the second end of the first resistor R10 is also connected with the negative end of the operational amplifier opamp. Here, the voltage on the conversion module DAC is equal to the voltage on the first resistor R10, so the analog current obtained through the conversion of the conversion module DAC is proportional to the current on the first resistor R10 as a whole, and it may be understood that the analog current flowing out of the conversion module DAC is proportional to the negative end current flowing into the negative end of the operational amplifier opamp. Since the negative feedback circuit of the operational amplifier opamp allows the negative end current flowing into the operational amplifier opamp to be proportional to the positive end current, the analog current flowing out of the conversion module DAC may also be proportional to the positive end current of the operational amplifier opamp.

Since the output end of the conversion module DAC is also connected with the source of the output transistor Mp, the analog current output by the conversion module DAC will flow into the source of the output transistor Mp and flow out from the drain of the output transistor Mp onto the output resistor $R_L$, and the flowed-out current is the output current $I_{out}$. Since the output current $I_{out}$ is equal to the analog current, the output current $I_{out}$ is also proportional to the positive end current.

In the embodiments of the disclosure, the operational amplifier opamp and the output transistor Mp form a negative feedback circuit, so that the voltages at two ends of the operational amplifier opamp are equal; while the first resistor R10 and the conversion module DAC form a parallel-connected circuit, and the second end of the first resistor R10 and the output end of the conversion module DAC are connected with the negative end of the operational amplifier opamp, so that the analog current obtained through the conversion of the conversion module DAC is proportional to the current on the first resistor R10, and given that the current on the first resistor R10 will eventually flow into the negative end of the operational amplifier opamp, so the analog current is proportional to the current flowing into the negative end of the operational amplifier opamp; and since that the negative end current flowing into the negative end of the operational amplifier opamp is proportional to the positive end current flowing into the positive end of the operational amplifier opamp, the analog current obtained through the conversion of the conversion module DAC is proportional to the positive end current flowing into the positive end of the operational amplifier opamp; and the accuracy of the output current Iout is finally ensured.

The digital-to-analog conversion circuit further includes a reference current module (REF), and the reference current module (REF) includes a reference transistor R0, a reference resistor Mp0 and a reference current source Iref; and the reference current module (REF) is configured to provide the positive end current for the second resistor R20 of the operational amplification module OP.

The first end of the reference transistor R0 of the reference current module REF is connected with the first end of the second resistor R20 of the operational amplification module OP, and the second end of the reference transistor R0 of the reference current module REF is connected with the source of the reference transistor Mp0.

Figure 4:
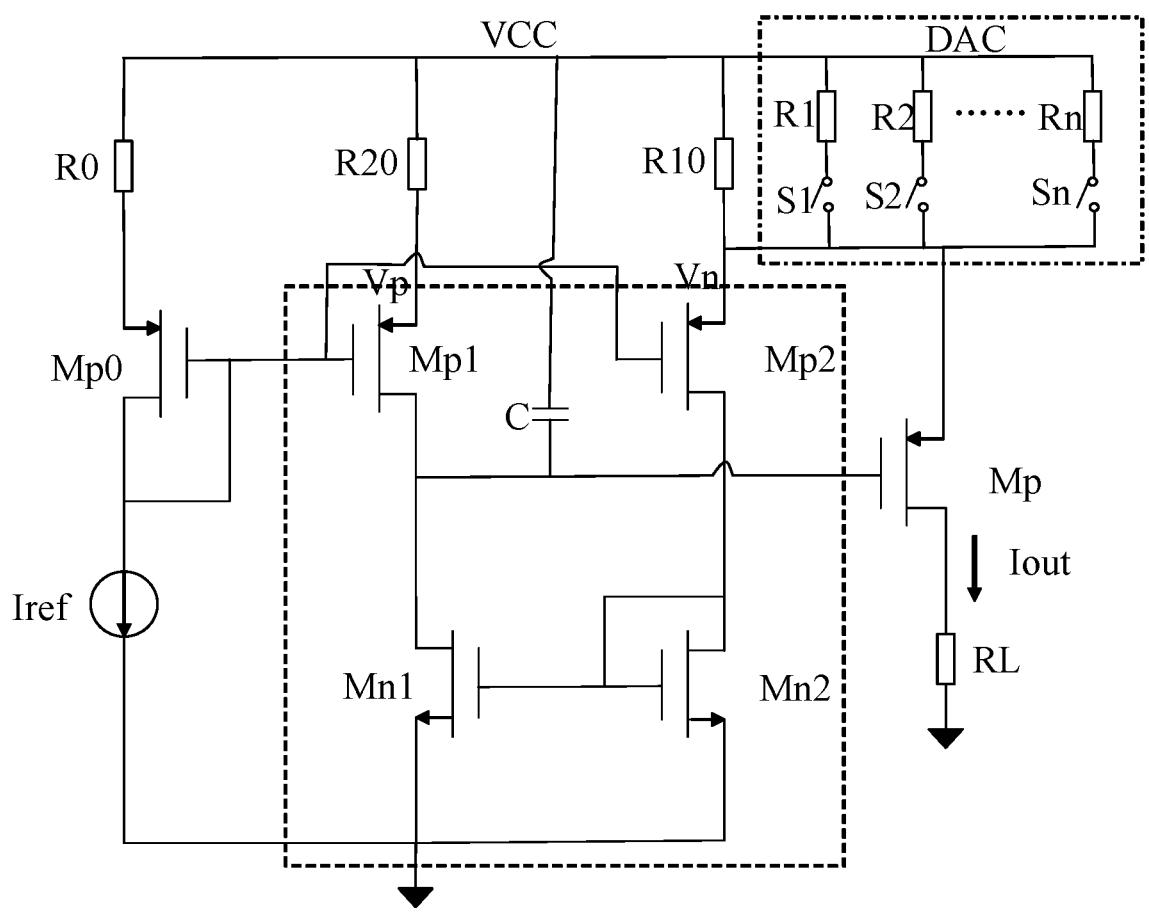
FIG. 4 is a schematic diagram of the structure of another digital-to-analog conversion circuit provided by an embodiment of the disclosure.

The drain of the reference transistor Mp0 of the reference current module REF is connected with the reference current source Iref, as illustrated in FIG. 4 for the details.

The operational amplifier opamp includes transistors; and the transistors corresponding to the positive and negative ends form a current mirror with the reference transistor Mp0 of the reference current module REF.

In the schematic diagram of the structure as illustrated in FIG. 4, the operational amplifier opamp has a specific transistor structure compared with that in FIG. 2. In this embodiment, the internal circuits of the positive end of the operational amplifier opamp are PMOS transistor Mp1 and NMOS transistor Mn1, and the internal circuits of the negative end of the operational amplifier opamp are PMOS transistor Mp2 and NMOS transistor Mn2. Here, in order to ensure the stability of the internal loop of the operational amplifier opamp, a capacitor C is set to provide compensation for the loop. Mp1 and Mp2 are equivalent to the positive and negative ends of the operational amplifier opamp, respectively, and the second end of the first resistor R10 is connected with the source of Mp2, here, the voltage at the source of Mp2 is noted as Vn, and the second end of the second resistor R20 is connected with the source of Mp1, here, the voltage at the source of Mp2 is noted as Vp. The gates of the Mp1, Mp2 and the reference transistor Mp0 are connected, and the gate of the reference transistor Mp0 is also connected with the drain of the reference transistor Mp0, and the drain of the Mp1 is also connected with the gate of the output transistor $M_P$ and the drain of Mn1, and the drain of the Mp2 is connected with the drain of the Mn2, and the gate of the Mn1 is connected with the gate of the Mn2, and the drain of the Mn2 is also connected with the gate of the Mn2. The circuits of the operational amplifier opamp of the embodiments of the disclosure include but are not limited to the types of transistors and their connection modes illustrated in FIG. 4; meanwhile, when the circuits and the types of transistors in the operational amplifier opamp change, the reference transistor Mp0 of the reference current module (REF) may also be adaptively changed to ensure that the transistor corresponding to the positive and negative ends of the operational amplifier opamp form a current mirror structure with the reference transistor Mp0 in the reference current module (REF).

The reference transistor Mp0 of the reference current module (REF) on the left side of FIG. 4, forms current mirrors with both Mp1 and Mp2 in the operational amplifier opamp, so that the current in the branch where Mp1 is located and the current in the branch where Mp2 is located are both proportional to the current provided by the reference current source Iref of the reference current module (REF), here, the current in the branch where Mp1 is located is equivalent to the positive end current flowing into the positive end of the operational amplifier opamp. When the Mp1 has the same size as the Mp0 and R0 is equal to R20, the positive end current flowing into the positive end of the operational amplifier opamp is equal to the current provided by the reference current source Iref.

When the drain of the Mp1 in the operational amplifier opamp is connected with the gate of the output transistor Mp, and the source of the output transistor Mp is connected with the source of the Mp2, the negative feedback circuit makes Vp and Vn be equal; and since the first end of the first resistor R10 is connected with the first end of the second resistor R20, the current on the first resistor R10 is proportional to the current on the second resistor R20. When R10 and R20 are equal, the current on the first resistor R10 is equal to the current on the second resistor R20.

The reference current module REF is configured to provide a bias voltage for the transistors in the operational amplifier opamp.

Specifically, as illustrated in FIG. 4, the reference current source Iref provides bias voltages for the transistors Mp1 and Mp2 of the operational amplifier opamp through the reference transistor Mp0 and the reference resistor R0, so that the transistors Mp1 and Mp2 operate normally.

The conversion module DAC includes multiple branches; and each of the branches includes a resistor and a switch; and the first end of the resistor of each of the branches is connected with the input end, the second end of the resistor is connected with the first end of the switch, and the second end of the switch is connected with the output end.

As illustrated in FIGS. 2 and 4, the conversion module DAC includes N branches, here N is a positive integer equal to or greater than 2, and exemplarily, the first branch has a resistor R1 and a switch S1, and the second branch has a resistor R2 and a switch S2, . . . , and the $n^{th}$ branch has a resistor Rn and a switch Sn. Here, the first ends of R1, R2, ..., Rn are all connected with the input end of the conversion module DAC, and the second ends of R1, R2, ..., Rn are all connected with the first ends of the switches S1, S2, ..., Sn, and the second ends of S1, S2, ..., Sn are all connected with the output end of the conversion module DAC.

In the embodiments of the disclosure, the transistor-type conversion module DAC in FIG. 1 is replaced by the form of a conversion circuit of resistors and switches, those skilled in the art may set the resistances of resistors of the conversion module DAC according to the amplitude of the reference current source Iref of the reference current module (REF) set inside the chip, thereby ensuring that only a very small voltage is consumed on meeting the conversion module DAC. Exemplarily, the reference current source Iref of the digital-to-analog conversion circuit provides a current of 1 A, and those skilled in the art may set the resistances of resistors of the conversion module DAC upon manufacturing the chip, so as to control the maximum voltage presented by the conversion module DAC as a whole to be 0.2 v, and in this way, even if the power supply voltage of the chip becomes lower and lower, for example, the power supply voltage is 1.5 v, and subtracts a voltage of 0.2 v which is consumed during the normal operation of the output transistor Mp, the voltage on the output resistor $R_L$ is still 1.1 v, and since the voltage on the output resistor $R_L$ is sufficient, then based on the circuit connection modes of the operational amplification module OP and the reference current module (REF), the output current Iout output from the output resistor $R_L$ finally in the embodiments of the disclosure may be proportional to the current provided by the reference current source Iref of the reference current module (REF), thereby achieving the purpose of controlling the accuracy of the output current of the digital-to-analog conversion circuit.

In addition, as illustrated in FIGS. 2 and 4, the input end of the conversion module, the first end of the first resistor R10 and the first end of the second resistor R20 are all connected with a power supply.

In FIG. 4, the first end of the reference resistor R0 of the reference current module REF is also connected with the power supply.

In the embodiments of the disclosure, the digital-to-analog conversion part of the current mirror digital-to-analog conversion circuit including transistors in other technologies is replaced by a digital-to-analog conversion part including resistors, thus avoiding problems in other technologies, such as that the digital-to-analog conversion part has to consume a higher voltage to satisfy the normal operation of the transistors, thereby causing the voltage distributed to the output resistor to be too small; and the structure of the digital-to-analog conversion part including resistors in the embodiments of the disclosure allows those skilled in the art to set an appropriate resistance of the resistor according to the amplitude of the current provided by the reference current source while guaranteeing the value of voltage on the output resistor, thereby the digital-to-analog conversion part consumes less voltage. Then, with the cooperation of using the digital-to-analog conversion circuit provided by the embodiments of the disclosure, the accuracy of the output current of the output resistor is finally ensured.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A digital-to-analog conversion circuit, comprising: an operational amplification module and a conversion module;
the operational amplification module comprises an operational amplifier, an output transistor and a first resistor;
an output end of the operational amplifier is connected with the gate of the output transistor, a negative end of the operational amplifier is connected with the source of the output transistor, and voltage at the negative end is supplemented based on the voltage supplied by the source of the output transistor, so that voltages at positive and negative ends are equal, as well as a negative end current flowing into the negative end is proportional to a positive end current flowing into the positive end; and
the conversion module is configured to convert digital signals to an analog current; and an input end of the conversion module is connected with a first end of the first resistor of the operational amplification module, and an output end of the conversion module is connected with a second end of the first resistor of the operational amplification module and the negative end of the operational amplifier, such that a same voltage as the first resistor of the operational amplification module is obtained, as well as the analog current proportional to the negative end current and positive end current is obtained; and the output end of the conversion module is also connected with the source of the output transistor, and is configured to receive the analog current and to make the analog current flow to an output resistor via the drain of the output transistor, to obtain an output current proportional to the positive end current.

2. The digital-to-analog conversion circuit of claim 1, wherein the operational amplification module further comprises a second resistor; and a first end of the second resistor is connected with the first end of the first resistor of the operational amplification module, and a second end of the second resistor is connected with the positive end of the operational amplifier.

3. The digital-to-analog conversion circuit of claim 2, wherein the circuit further comprises a reference current module; and
the reference current module comprises a reference resistor, a reference transistor and a reference current source; and the reference current module is configured to provide the positive end current for the second resistor of the operational amplification module.

4. The digital-to-analog conversion circuit of claim 3, wherein
a first end of the reference resistor of the reference current module is connected with the first end of the second resistor of the operational amplification module, and a second end of the reference resistor of the reference current module is connected with the source of the reference transistor.

5. The digital-to-analog conversion circuit of claim 4, wherein
the first end of the reference resistor of the reference current module is also connected with the power supply.

6. The digital-to-analog conversion circuit of claim 3, wherein
the drain of the reference transistor of the reference current module is connected with the reference current source.

7. The digital-to-analog conversion circuit of claim 3, wherein
the operational amplifier comprises transistors; and the transistors corresponding to the positive and negative ends form a current mirror with the reference transistor of the reference current module.

8. The digital-to-analog conversion circuit of claim 7, wherein
the reference current module is configured to provide a bias voltage for the transistors in the operational amplifier.

9. The digital-to-analog conversion circuit of claim 1, wherein
the conversion module comprises a plurality of branches; each of the branches comprises a resistor and a switch; and a first end of the resistor of each of the branches is connected with the input end, a second end of the resistor is connected with a first end of the switch, and a second end of the switch is connected with the output end.

10. The digital-to-analog conversion circuit of claim 1, wherein
the input end of the conversion module, the first end of the first resistor and the first end of the second resistor are all connected with a power supply.

11. An electronic apparatus comprising the digital-to-analog conversion circuit of claim 1, wherein
the output end of the conversion module is connected in parallel with the first resistor, making a current on the conversion module proportional to the output current, thereby improving accuracy of the output current; and
the output resistor has a resistance of controllable according to an amplitude of current provided by a reference current source while ensuring a value of voltage on the output resistor, thereby facilitating the digital-to-analog conversion circuit consuming less voltage while ensuring accuracy of the output current of the output resistor.

12. The electronic apparatus of claim 11, wherein the operational amplification module further comprises a second resistor; and a first end of the second resistor is connected with the first end of the first resistor of the operational amplification module, and a second end of the second resistor is connected with the positive end of the operational amplifier.

13. The electronic apparatus of claim 12, wherein the circuit further comprises a reference current module; and
the reference current module comprises a reference resistor, a reference transistor and a reference current source; and the reference current module is configured to provide the positive end current for the second resistor of the operational amplification module.

14. The electronic apparatus of claim 13, wherein
a first end of the reference resistor of the reference current module is connected with the first end of the second resistor of the operational amplification module, and a second end of the reference resistor of the reference current module is connected with the source of the reference transistor.

15. The electronic apparatus of claim 14, wherein
the first end of the reference resistor of the reference current module is also connected with the power supply.

16. The electronic apparatus of claim 13, wherein
the drain of the reference transistor of the reference current module is connected with the reference current source.

17. The electronic apparatus of claim 13, wherein
the operational amplifier comprises transistors; and the transistors corresponding to the positive and negative ends form a current mirror with the reference transistor of the reference current module.

18. The electronic apparatus of claim 17, wherein
the reference current module is configured to provide a bias voltage for the transistors in the operational amplifier.

19. The electronic apparatus of claim 11, wherein
the conversion module comprises a plurality of branches; each of the branches comprises a resistor and a switch; and a first end of the resistor of each of the branches is connected with the input end, a second end of the resistor is connected with a first end of the switch, and a second end of the switch is connected with the output end.

20. The electronic apparatus of claim 11, wherein
the input end of the conversion module, the first end of the first resistor and the first end of the second resistor are all connected with a power supply.

* * * * *